May 25, 1965 T. H. JOHNSON 3,185,842

METHOD OF STABILIZATION OF DEWAR PACKAGE THIN FILM DETECTORS

Filed Nov. 20, 1962

INVENTOR.
THOMAS H. JOHNSON,
BY John M. Koch
ATTORNEY.

United States Patent Office 3,185,842

Patented May 25, 1965

3,185,842

METHOD OF STABILIZATION OF DEWAR PACKAGE THIN FILM DETECTORS

Thomas H. Johnson, Santa Barbara, Calif., assignor to Santa Barbara Research Center, Goleta, Calif., a corporation of California Filed Nov. 20, 1962, Ser. No. 239,016
6 Claims. (Cl. 250—83)

Figure 1:
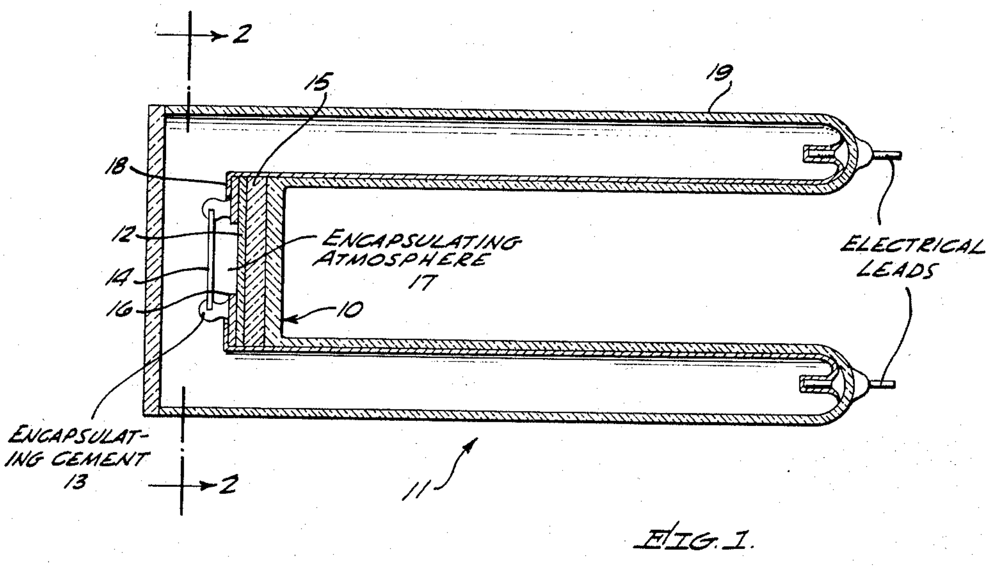

This invention relates to a means of stabilizing a thin film infrared detector mounted in a Dewar package, and in particular, to such a means for a sensitized detector which is sensitive to temperature, moisture and oxidizing atmosphere.

An essential step in constructing an infrared detector of high sensitivity is that of baking-out the constructed package during the course of its evacuation at temperatures of approximately 100° C. to make sure that the package possesses long-term vacuum stability. Furthermore, the fabricated detector package, after manufacture, should be capable of being stored at temperatures up to about 75° C. for hundreds of hours without the occurrence of degradation of its operating characteristics.

It is accepted practice in the art to mount infrared detectors, such as those made of lead sulphide, lead selenide, lead telluride, and similar films, in a vacuum Dewar flask so that the detectors can be cooled to low temperatures, at which they exhibit improved sensitivity toward infrared radiation. A vacuum chamber, or wall, is known to be the most efficient form of thermal insulation that can be used in such a device to isolate the cold re-entrant, or inner, portion of the detector package, or Dewar flask, on which the detector is mounted, from the warm outer wall of the flask. This insulation serves two very important functions. First, it limits the heat load on the inner, or re-entrant, portion of the Dewark flask, and thus greatly reduces the cooling capacity required to maintain the detector at the desired temperature. Secondly, it prevents the outer wall of the Dewar flask, including the transparent window usually employed therewith, from being cooled below the normal ambient temperature, and thus avoids any condensation of atmospheric moisture on the window. Such condensation is objectionable because it would attenuate the radiant energy to be detected or viewed by the detector.

Prior art methods of mounting the infrared detector in Dewar packages generally fail to take into account the deleterious effect which the vacuum has on a sensitized film, such as chemically deposited lead sulphide, lead selenide and lead telluride film. A critical step in the preparation of a sensitive film, such as lead selenide detector film, for example, is the sensitization of the lead selenide film, either by chemical oxidation during the film formation, or by baking the prepared film in air, or in an oxygen, or other sensitizing atmosphere.

Numerous tests have been developed to explain the mechanism whereby oxygen serves as the sensitizing agent for the lead sulphide, lead selenide, lead telluride and similar compounds from which infrared detector films are prepared. However, there is general agreement in the field of solid state physics of thin film detectors that optimum sensitization of such detectors is achieved by the introduction, by one means or another, of a finite amount of oxygen into the detector films. Although this invention is not concerned with the preparation of such detectors, it does relate to a means or method of packaging such detectors designed to avoid the loss of oxygen from the detector film, and to thus prevent a resulting degradation of oxidized detector characteristics.

A prior art method most commonly employed in packaging a thin film detector, and which suffers from the disadvantage of degradation of detector characteristics, consists of cementing the detector substrate in position on the re-entrant portion of a Dewar flask, and assembling the flask and Dewar packaged detector as a single unit.

Accordingly, it is an important object of this invention to provide a means or method by which thin film infrared detectors can be mounted in a vacuum Dewar flask without degradation of highly optimized characteristics of the film.

Another object of this invention is to provide a means or method of protecting the detector film of an infrared detector package from the vacuum environment of the Dewar flask forming a part of the package.

Additional objects will become apparent from the following description, which is given primarily for purposes of illustration, and not limitation.

Stated in general terms, the objects of this invention are attained by enclosing or encapsulating the infrared detector film, such as a film of lead selenide, lead sulphide, lead telluride, etc., in a gaseous atmosphere in a manner to secure it in a gas-tight compartment and thus protect it from the vacuum environment of the Dewar package.

Figure 2:
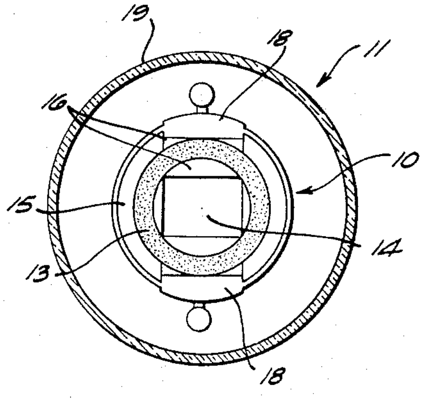

A more detailed description of specific embodiments of this invention is given below with reference to the accompanying drawing, wherein:

FIG. 1 is a sectional elevational view showing a vacuum Dewar packaged thin film detector wherein the detector is air-encapsulated or enclosed in accordance with the present invention; and FIG. 2 is a cross-sectional view taken along the line 2—2 of FIG. 1 showing details of the encapsulation of the detector film and auxiliary electrical connection to the film.

The inner tube or re-entrant portion 10 of the Dewar flask 11 is fitted with a cryostat, or other cooling device or means (not shown) for cooling the detector film 12 to its normal desired operating temperature, such as —196° C. The detector film 12, the encapsulating cement 13 and the encapsulating window 14 all are subjected to severe temperature cycling each time that the detector is operated for the detection of infrared radiation. It is necessary, therefore, that care be exercised in the choice of the encapsulating cement 13 and window 14 so that appropriate materials are used which have a thermal coefficient of expansion that is compatible with that of the detector substrate 15 that is employed.

In addition, it is necessary to employ an encapsulating window 14 which has the proper infrared transmission for the particular detector film 12 that is being used. An epoxy cement sold on the market by Emerson & Cuming, Inc., as Eccobond No. 51 has been found to be very satisfactory when used as the encapsulating cement 13 with a detector film 12 made of lead sulphide or lead selenide, for example. It will be understood, however, that numerous other epoxy type cements, or other types of cements, can be used with varying degrees of success with various detector film materials.

With soft glass or strontium titanate detector substrates 15, soft glass, crystal quartz, or strontium titanate encapsulating windows 14 preferably should be employed. With fused quartz detector substrates 15, fused quartz windows 14 should be employed. It will be understood that these materials are not the only ones that can be employed. Many other materials will occur to persons experienced in the field of infrared detectors. However, the examples given above illustrate the principle involved in selecting the preferred materials for the cement 13, window 14 and substrate 15.

It should be noted that the encapsulating cement 13 bonds to both the encapsulating window 14 and the detector substrate 15 as well as to a partial area of the two evaporated gold electrodes 16. In this manner, the encapsulating cement 13 encloses the sensitive area of the detector film 12 in the encapsulating atmosphere 17. Atmosphere 17 preferably is air or oxygen.

The Dewar-packaged thin film detector of the invention is constructed as follows. A film of PbS, PbSe or PbTe 12 is deposited upon the detector substrate 15 by either chemical or evaporation techniques. Gold electrodes 16 are then deposited by evaporation on top of the detector film 12. Following an appropriate sensitization of the deposited film 12, an encapsulating window 14 is attached over the sensitive area of the detector film by means of the encapsulating cement 13. The cement and window are applied and oriented so that the actual sensitive element of the detector 12 has an unobstructed view. The encapsulating cement is then cured by the appropriate baking and aging procedure.

The detector element is then mounted in the vacuum Dewar 11 utilizing the following steps. The detector substrate 15 is cemented to the end of the inner core 10 of the vacuum Dewar flask 11. Electrical contact is made from the detector gold electrodes 16 to the conductive stripes 18 on the inner core. The package is made using soldered wires or a conductive paint, or both. The inner core 10 and the outer shell 19 of the vacuum Dewar 11 are then joined by means of flame fusing the two parts together. The assembled unit is then attached to the manifold of a high vacuum pumping system and evacuated to at least a pressure of $10^{-6}$ mm. of mercury. During this evacuation process the entire Dewar package is heated for several hours at 100° C. The Dewar package is then sealed-off from the vacuum manifold to complete the construction and assembly operation.

Alternate methods of construction of the Dewar package will occur to persons skilled in the field of infrared radiation detector packaging, once the basic concept of this invention is observed. Illustrations of one or two examples will prove this point. The thin film detector substrate 15 can be mounted in the bottom region of a small glass cup (not shown), which has the appropriate number of metal feed-throughs, and sealed with an appropriate window 14. The window 14 can be attached by soldering or by a suitable cement 13. This sealed cup can be mounted in the normal detector position in the vacuum Dewar package 11. Electrical contact can be made to metal pins on the cup in the usual prior art manner.

Among the advantages of this invention over the prior art methods in the fact that the detector film is not exposed to the vacuum environment of the Dewar package. As a resula of this fact, the detector film is not subjected to a desorption process. As a consequence, the utilization of the method of this invention makes it possible to employ a high bake-out temperature, such as 100° C., during the evacuation of the Dewar detector package. Furthermore, encapsulated vacuum Dewar packaged detector films such as chemically deposited lead selenide handled in accordance with the present invention, can be stored at elevated temperatures in excess of 70° C. for extended periods of time. For example, such detector films can be stored at temperatures in excess of 70° C. for about 1000 hours without degradation of any of their operating characteristics.

Similarly, a metal cup (not shown) can be used as an alternative procedure. In this latter case, electrical leads can be brought out through metal pins sealed to the metal cup through glass insulator beads.

Obviously many other modifications and variations of the present invention are possible in the light of the above teachings. It is therefore to be understood that within the scope of the appended claims the invention can be practiced otherwise than as specifically described.

What is claimed is:

1. In an infrared detector package including a detector cell mounted upon the re-entrant portion of an evacuated Dewar flask, the improvement which consists of sealing the infrared sensitive layer of the cell in a gas-filled, gas-tight compartment on the evacuated side of the re-entrant portion of the Dewar flask.

2. In an infrared detector package including a detector cell mounted upon the re-entrant portion of an evacuated Dewar flask, the improvement which consists of sealing the infrared sensitive layer of the cell in an air-filled, gas-tight compartment on the evacuated side of the re-entrant portion of the Dewar flask.

3. In an infrared detector package including a detector cell mounted upon the re-entrant portion of an evacuated Dewar flask, the improvement which consists of sealing the infrared sensitive layer of the cell in an air-filled, gas-tight compartment on the evacuated side of the re-entrant portion of the Dewar flask, said infrared sensitive layer being selected from the group consisting of lead sulphide, lead selenide and lead telluride.

4. In an infrared detector package including a detector cell mounted upon the re-entrant portion of an evacuated Dewar flask, the improvement which consists of sealing the infrared sensitive layer of the cell in a gas-filled, gas-tight compartment on the evacuated side of the re-entrant portion of the Dewar flask, said compartment consisting of a substrate upon which the infrared sensitive layer of the cell is supported, an encapsulating window in spaced relationship with the infrared sensitive layer and encapsulating cement sealing the window to the substrate to form the gas-tight compartment.

5. In an infrared detector package including a detector cell mounted upon the re-entrant portion of an evacuated Dewar flask, the improvement which consists of sealing the infrared sensitive layer of the cell in a gas-filled, gas-tight compartment on the evacuated side of the re-entrant portion of the Dewar flask, said compartment consisting of a substrate upon which the infrared sensitive layer of the cell is supported, an encapsulating window in spaced relationship with the infrared sensitive layer and encapsulating cement sealing the window to the substrate to form the gas-tight compartment, and said infrared sensitive layer being selected from the group consisting of lead sulphide, lead selenide and lead telluride.

6. In an infrared detector package including a detector cell mounted upon the re-entrant portion of an evacuated Dewar flask, the improvement which consists of sealing the infrared sensitive layer of the cell in an air-filled, gas-tight compartment on the evacuated side of the re-entrant portion of the Dewar flask, said compartment consisting of a substrate of fused quartz upon which the infrared sensitive layer of the cell is supported, an encapsulating window of fused quartz in spaced relationship with the infrared sensitive layer and an epoxy encapsulating cement sealing the window to the substrate to form the gas-tight compartment.

References Cited by the Examiner

UNITED STATES PATENTS

| | | | |
|---|---|---|---|
| 2,671,154 | 3/54 | Burstein | 250—83.3 |
| 2,742,578 | 4/56 | Nicolson et al. | 250—83.3 |
| 3,062,959 | 11/62 | Sclar | 250—83 X |
| 3,079,504 | 2/63 | Hutchens | 250—83 |

RALPH G. NILSON, *Primary Examiner.*

ARCHIE R. BORCHELT, *Examiner.*